United States Patent
Kawase et al.

(10) Patent No.: US 11,239,123 B2
(45) Date of Patent: Feb. 1, 2022

(54) SEMICONDUCTOR MODULE, SEMICONDUCTOR DEVICE, AND VEHICLE

(71) Applicant: Mitsubishi Electric Corporation, Tokyo (JP)

(72) Inventors: Tatsuya Kawase, Tokyo (JP); Noboru Miyamoto, Tokyo (JP); Mikio Ishihara, Tokyo (JP); Junji Fujino, Tokyo (JP); Yuji Imoto, Tokyo (JP); Naoki Yoshimatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 768 days.

(21) Appl. No.: 14/888,600

(22) PCT Filed: Aug. 29, 2013

(86) PCT No.: PCT/JP2013/073174
§ 371 (c)(1),
(2) Date: Nov. 2, 2015

(87) PCT Pub. No.: WO2015/029186
PCT Pub. Date: Mar. 5, 2015

(65) Prior Publication Data
US 2016/0111345 A1    Apr. 21, 2016

(51) Int. Cl.
*H01L 23/053* (2006.01)
*H01L 23/31* (2006.01)
(Continued)

(52) U.S. Cl.
CPC ............ *H01L 23/053* (2013.01); *B60L 50/51* (2019.02); *H01L 21/4871* (2013.01);
(Continued)

(58) Field of Classification Search
CPC ... H01L 23/053; H01L 23/36; H01L 23/3735; H01L 21/4871; H01L 23/3107;
(Continued)

(56) References Cited

U.S. PATENT DOCUMENTS 4,502,386 A * 3/1985 Cappel ................... B41F 31/04
101/352.09
5,153,385 A * 10/1992 Juskey ................ H01L 23/3121
174/260

(Continued)

FOREIGN PATENT DOCUMENTS

CN    103137576 A    6/2013
DE    19638669 A1    4/1998
(Continued)

OTHER PUBLICATIONS

An Office Action issued by the State Intellectual Property Office dated Apr. 17, 2018, which corresponds to Chinese Patent Application No. 201380079233.9 and is related to U.S. Appl. No. 14/888,600; with English language translation.
(Continued)

*Primary Examiner* — Benjamin Tzu-Hung Liu
(74) *Attorney, Agent, or Firm* — Studebaker & Brackett PC

(57) ABSTRACT

A base plate (1) includes a fixed surface and a radiating surface which is a surface opposite to the fixed surface. An insulating substrate (3) is bonded to the fixed surface of the base plate (1). Conductive patterns (4,5) are provided on the insulating substrate (3). Semiconductor chips (7,8) are bonded to the conductive pattern (4). An Al wire (12) connects top surfaces of the semiconductor chip (8) to the conductive pattern (5). The insulating substrate (3), the conductive patterns (4,5), the semiconductor chips (7 to 10) and the Al wires (11 to 13) are sealed with resin (16). The base plate (1) includes a metal part (19) and a reinforcing
(Continued)

member (20) provided in the metal part (19). A Young's modulus of the reinforcing member (20) is higher than a Youngs modulus of the metal part (19).

15 Claims, 9 Drawing Sheets

(51) Int. Cl.
| | |
|---|---|
| *H01L 23/367* | (2006.01) |
| *H01L 23/492* | (2006.01) |
| *H01L 23/498* | (2006.01) |
| *H01L 23/00* | (2006.01) |
| *H01L 23/36* | (2006.01) |
| *H01L 23/373* | (2006.01) |
| *H01L 21/48* | (2006.01) |
| *B60L 50/51* | (2019.01) |
| *H01L 23/40* | (2006.01) |
| *H01L 25/07* | (2006.01) |

(52) U.S. Cl.
CPC .......... *H01L 23/3107* (2013.01); *H01L 23/36* (2013.01); *H01L 23/3675* (2013.01); *H01L 23/3735* (2013.01); *H01L 23/492* (2013.01); *H01L 23/49838* (2013.01); *H01L 24/49* (2013.01); *H01L 23/3121* (2013.01); *H01L 23/4006* (2013.01); *H01L 23/562* (2013.01); *H01L 24/45* (2013.01); *H01L 24/48* (2013.01); *H01L 25/072* (2013.01); *H01L 2224/45124* (2013.01); *H01L 2224/48137* (2013.01); *H01L 2224/48227* (2013.01); *H01L 2224/49111* (2013.01); *H01L 2224/49175* (2013.01); *H01L 2924/13055* (2013.01); *H01L 2924/13091* (2013.01); *H01L 2924/181* (2013.01); *H01L 2924/19107* (2013.01)

(58) Field of Classification Search
CPC ............... H01L 23/3675; H01L 23/492; H01L 23/49838; H01L 24/49; H01L 2224/49111; H01L 23/562; H01L 2224/49175; H01L 2224/48137; H01L 23/4006; H01L 2924/19107; H01L 2924/13055; H01L 23/3121; H01L 24/45; H01L 2224/45124; H01L 25/072; H01L 2924/181; H01L 24/48; H01L 2924/13091; H01L 2224/48227; H01L 2224/32225; H01L 2224/92247; H01L 2224/73265; B60L 50/51; Y02T 10/70
See application file for complete search history.

(56) References Cited

U.S. PATENT DOCUMENTS

| | | | | |
|---|---|---|---|---|
| 5,864,178 A * | 1/1999 | Yamada | ............... | H01L 23/3121 257/737 |
| 2001/0023983 A1* | 9/2001 | Kobayashi | ............... | H01L 24/97 257/698 |
| 2005/0029666 A1* | 2/2005 | Kurihara | ................. | H01L 24/13 257/772 |
| 2008/0023721 A1* | 1/2008 | Lee | ....................... | H01L 33/486 257/99 |
| 2013/0135824 A1* | 5/2013 | Harubeppu | ............. | H01L 23/34 361/709 |
| 2013/0256867 A1* | 10/2013 | Mori | .................... | H01L 23/3735 257/712 |
| 2014/0057131 A1* | 2/2014 | Osanai | ............... | B22D 19/0081 428/633 |
| 2015/0223317 A1* | 8/2015 | Oi | .......................... | H05K 1/181 361/709 |
| 2016/0005671 A1* | 1/2016 | Tsuyuno | ............... | H01L 25/072 257/789 |

FOREIGN PATENT DOCUMENTS

| | | | | |
|---|---|---|---|---|
| JP | H05-304248 A | | 11/1993 | |
| JP | 2004-14599 | * | 1/2004 | |
| JP | 2004-014599 A | | 1/2004 | |
| JP | 2004014599 A | * | 1/2004 | ............. H01L 24/73 |
| JP | 2004-266003 A | | 9/2004 | |
| JP | 2004266003 A | * | 9/2004 | |
| JP | 2005-311019 A | | 11/2005 | |
| JP | 2006-032617 A | | 2/2006 | |
| JP | 2004-266003 | * | 4/2006 | |
| JP | 2006-114641 | * | 4/2006 | |
| JP | 2006-114641 A | | 4/2006 | |
| JP | 2006114641 A | * | 4/2006 | |
| JP | 2006-351737 A | | 12/2006 | |
| JP | 3885748 A | | 12/2006 | |
| JP | 2007-184315 A | | 7/2007 | |
| JP | 2008075409 | * | 6/2008 | |
| JP | WO-2008075409 | * | 6/2008 | |
| JP | WO 2008075409 | * | 6/2008 | |
| JP | 2012-089727 | * | 10/2010 | |
| JP | 2011-189354 A | | 9/2011 | |
| JP | 201215222 A | | 1/2012 | |
| JP | 2012-038850 A | | 2/2012 | |
| JP | 2012089727 | * | 5/2012 | |
| JP | 2012089727 A | * | 5/2012 | |
| JP | 2012-164697 | * | 8/2012 | |
| JP | 2012-164697 A | | 8/2012 | |
| JP | 2012164697 A | * | 8/2012 | |
| JP | 2012-248774 A | | 12/2012 | |
| JP | 2013-016684 A | | 1/2013 | |
| JP | 2013-105789 A | | 5/2013 | |
| JP | WO 2014/034245 | * | 3/2014 | |
| WO | 2008075409 A1 | | 6/2008 | |
| WO | 2012/127695 A1 | | 9/2012 | |

OTHER PUBLICATIONS

CN Office Action dated Sep. 20, 2017, from corresponding CN Appl No. 201380079233.9, with English translation, 14 pp.
An Office Action; "Notice of Reasons for Rejection," issued by the Japanese Patent Office dated Jun. 7, 2016, which corresponds to Japanese Patent Application No. 2015-533865 and is related to U.S. Appl. No. 14/888,600; with English language partial translation.
International Search Report issued in PCT/JP2013/073174, dated Nov. 26, 2013.
Notification of Transmittal of Translation of the International Preliminary Report on Patentability and Translation of Written Opinion of the International Searching Authority; PCT/JP2013/073174 dated Mar. 10, 2016.
An Office Action mailed by The State Intellectual Property Office of the People's Republic of China dated Aug. 13, 2018, which corresponds to Chinese Patent Application No. 201380079233.9 and is related to U.S. Appl. No. 14/888,600.
An Office Action mailed by the German Patent and Trade Mark Office dated Oct. 31, 2019, which corresponds to German Patent Application No. DE112013007390.0 with English Translation.

* cited by examiner

SEMICONDUCTOR MODULE, SEMICONDUCTOR DEVICE, AND VEHICLE

TECHNICAL FIELD

The present invention relates to a semiconductor module and a semiconductor device used to control, for example, a vehicle-mounted motor, and a vehicle using the same.

BACKGROUND ART

In potting-resin-sealed type semiconductor modules, an insulating substrate, a conductive pattern and a semiconductor chip are placed in order on a base plate, surrounded by a case, and the interior of the case is sealed with potting resin (e.g., see Patent Literature 1).

CITATION LIST

Patent Literature

Patent Literature 1: Japanese Patent Laid-Open No. 5-304248

SUMMARY OF INVENTION

Technical Problem

In a potting-resin-sealed type semiconductor module, a base plate and a metal plate are bonded together via an insulating substrate. When the base plate and a conductive pattern are made of different materials, both have different coefficients of linear expansion, and this causes considerable warpage due to heat. Even if both components are made of the same material, warpage still occurs because there is a large difference in shape between both components. If the case is bonded to the base plate and sealed with potting resin in this condition, it is difficult to control warpage of the product. This results in a problem that reliability in P/C (power cycle), H/C (heat cycle) properties or the like deteriorates.

The present invention has been implemented to solve the above-described problem, and it is an object of the present invention to provide a semiconductor module, a semiconductor device and a vehicle capable of improving reliability.

Means for Solving the Problems

A semiconductor module according to the present invention includes: a base plate including a fixed surface and a radiating surface which is a surface opposite to the fixed surface; an insulating substrate bonded to the fixed surface of the base plate; first and second conductive patterns on the insulating substrate; a semiconductor chip on the first conductive pattern; a wiring member connecting the semiconductor chip to the second conductive pattern; and resin sealing the fixed surface of the base plate, the insulating substrate, the first and second conductive patterns, the semiconductor chip, and the wiring member, wherein the base plate includes a metal part, and a reinforcing member provided in the metal part and having a Young's modulus which is higher than a Young's modulus of the metal part.

Advantageous Effects of Invention

The present invention makes it possible to improve reliability.

DESCRIPTION OF EMBODIMENTS

A semiconductor module, a semiconductor device, and a vehicle according to the embodiments of the present invention will be described with reference to the drawings. The same components will be denoted by the same symbols, and the repeated description thereof may be omitted.

Embodiment 1

Figure 1:
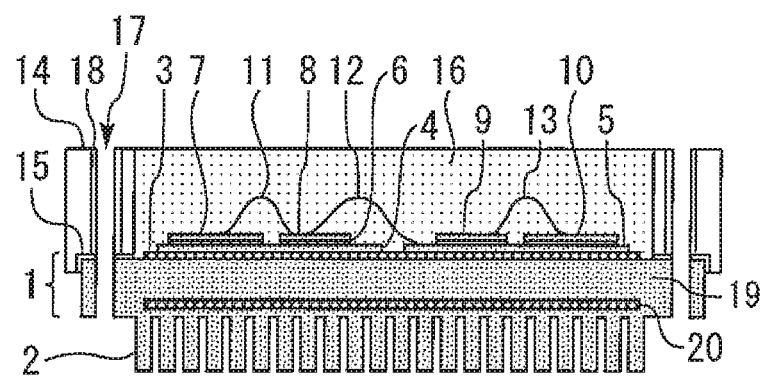
FIG. 1 is a cross-sectional view illustrating a semiconductor module according to Embodiment 1 of the present invention.

FIG. 1 is a cross-sectional view illustrating a semiconductor module according to Embodiment 1 of the present invention. A base plate 1 includes a fixed surface (top surface) and a radiating surface (undersurface) which is a surface opposite to the fixed surface. The base plate 1 has at least one protrusion structure 2 on the radiating surface. The protrusion structure 2 is a radiator fin, which increases cooling efficiency of the radiating surface of the base plate 1. The materials of the base plate 1 and the protrusion structure 2 may be identical or different. For example, to increase heat dissipation, a material having higher thermal conductivity than that of the base plate 1 may be used for the protrusion structure 2.

An insulating substrate 3 is melt-bonded to the fixed surface of the base plate 1. The material of the insulating substrate 3 is ceramics such as SiN, AlN or $AlO_3$. The base plate 1 has an external shape of 70 mm×100 mm and a thickness of 3 mm. The external shape of the insulating substrate 3 is a size smaller than the base plate 1, and has a thickness of 0.635 mm.

Conductive patterns 4 and 5 are provided on the insulating substrate 3. For an improvement of heat dissipation properties, the thickness of the insulating substrate 3 is preferably smaller than the thicknesses of the base plate 1, and conductive patterns 4 and 5. Semiconductor chips 7 and 8 are bonded to the conductive pattern 4 via solder 6, and semiconductor chips 9 and 10 are bonded to the conductive pattern 5 via the solder 6. An Al wire 11 connects top surfaces of the semiconductor chips 7 and 8, an Al wire 12 connects the top surface of the semiconductor chip 8 and the conductive pattern 5, and an Al wire 13 connects top surfaces of the semiconductor chips 9 and 10.

A resin-based case 14 that surrounds the insulating substrate 3, the conductive patterns 4 and 5, the semiconductor chips 7 to 10 and the Al wires 11 to 13 is bonded to the fixed surface of the base plate 1 using an adhesive 15. The inside of the case 14 is sealed with resin 16. A hole 17 is provided which penetrates a peripheral portion of the base plate 1 and a peripheral portion of the resin 16. A collar 18 made of a material (Fe or the like) more resistant than the base plate 1 is inserted into the hole 17 of the resin 16.

The base plate 1 includes a metal part 19 and a reinforcing member 20 provided in the metal part 19. The material of the metal part 19 is a metal such as Al or Cu, and the material of the reinforcing member 20 is ceramics such as SiN, AlN or $AlO_3$. A Young's modulus of the reinforcing member 20 is 100 GPa or higher, which is higher than a Young's modulus of metal part 19 (70 GPa in the case of Al).

A linear expansion coefficient of the metal part 19 is 22 ppm/° C., a linear expansion coefficient of the reinforcing member 20 is 4 ppm/° C. and a linear expansion coefficient of the entire base plate 1 including both is 10 to 20 ppm/° C. In contrast to this, a linear expansion coefficient of the resin 16 is 8 to 16 ppm/° C., which is a numerical value intermediate between the linear expansion coefficient of the metal part 19 and the linear expansion coefficient of the reinforcing member 20, and is therefore on the same level with the linear expansion coefficient of the entire base plate 1. Note that the linear expansion coefficient of the semiconductor chips 7 to 10 is 2.6 ppm/° C.

Figure 2:
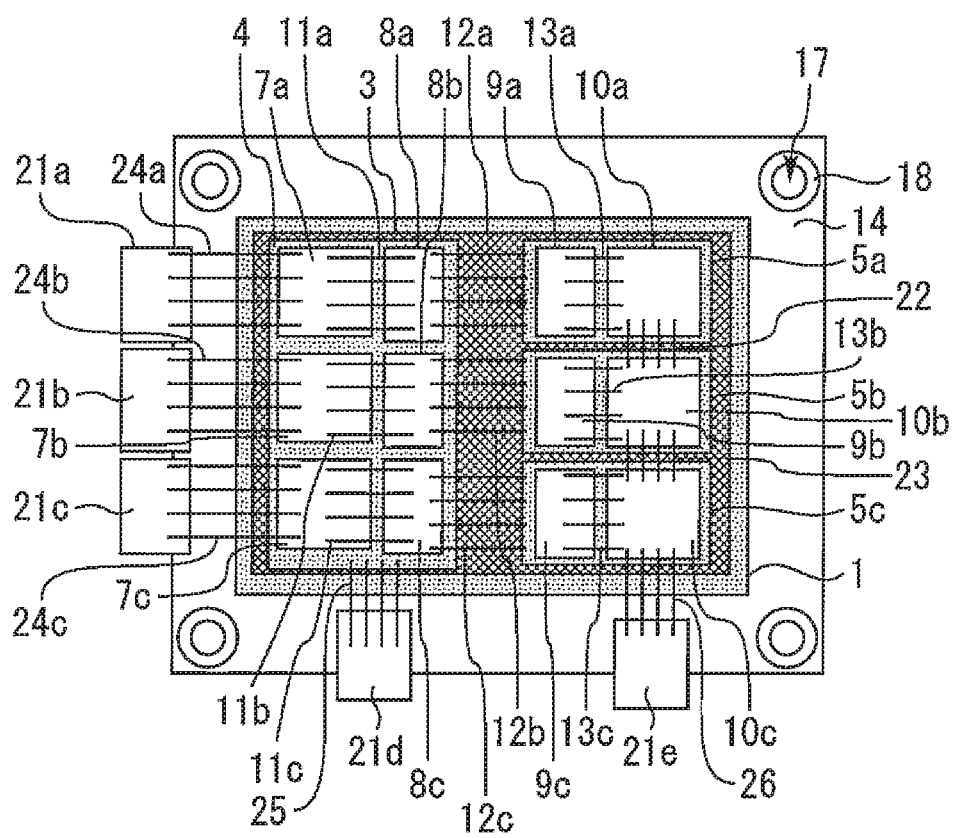
FIG. 2 is a top view illustrating the interior of the semiconductor module according to Embodiment 1 of the present invention.
Figure 3:
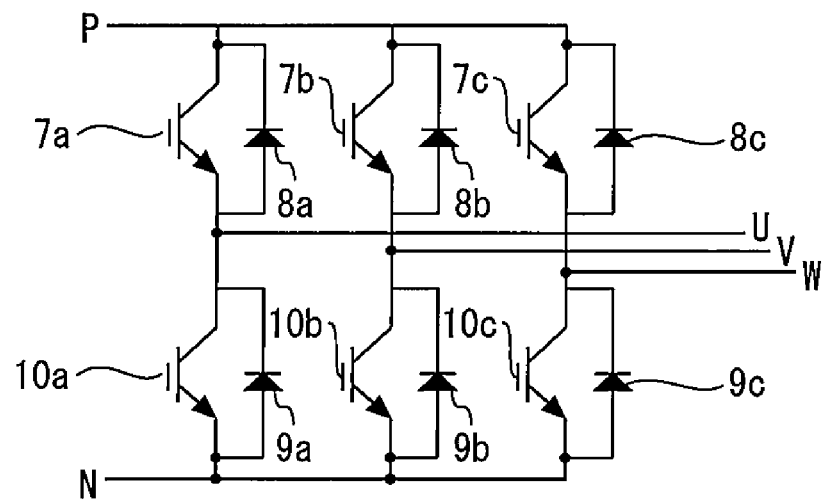
FIG. 3 is a circuit diagram illustrating the semiconductor module according to Embodiment 1 of the present invention.

FIG. 2 is a top view illustrating the interior of the semiconductor module according to Embodiment 1 of the present invention. FIG. 3 is a circuit diagram illustrating the semiconductor module according to Embodiment 1 of the present invention. The resin 16 is omitted in the top view. The semiconductor module has a 6-in-1 structure, that is, a structure in which six switching elements are mounted on one module. Here, the switching elements are IGBTs. Note that gate electrodes of the switching elements and terminals connected thereto are omitted for simplification.

Switching elements 7a to 7c correspond to the semiconductor chip 7, diodes 8a to 8c correspond to the semiconductor chip 8, diodes 9a to 9c correspond to the semiconductor chip 9, and switching elements 10a to 10c correspond to the semiconductor chip 10. Metal frames 21a to e correspond to a U electrode, a V electrode, a W electrode, a P electrode and an N electrode respectively.

Undersurfaces of the switching elements 7a to 7c and the diodes 8a to 8c are connected to the conductive pattern 4. Undersurfaces of the diode 9a and the switching element 10a are connected to a conductive pattern 5a, undersurfaces of the diode 9b and the switching element 10b are connected to a conductive pattern 5b, and undersurfaces of the diode 9c and the switching element 10c are connected to a conductive pattern 5c.

An Al wire 11a connects top surfaces of the switching element 7a and the diode 8a, an Al wire 11b connects top surfaces of the switching element 7b and the diode 8b, and an Al wire 11c connects top surfaces of the switching element 7c and the diode 8c.

Al wires 12a to 12c connect top surfaces of the diodes 8a to 8c and the conductive patterns 5a to 5c respectively. An Al wire 13a connects top surfaces of the diode 9a and the switching element 10a, an Al wire 13b connects top surfaces of the diode 9b and the switching element 10b, and an Al wire 13c connects top surfaces of the diode 9c and the switching element 10c.

An Al wire 22 connects top surfaces of the switching elements 10a and 10b, and an Al wire 23 connects top surfaces of the switching elements 10b and 10c. Al wires 24a to 24c connect top surfaces of the switching elements 7a to 7c and the metal frames 21a to 21c respectively. An Al wire 25 connects the conductive pattern 4 and the metal frame 21d. An Al wire 26 connects a top surface of the switching element 10c and the metal frame 21e.

Figure 4:
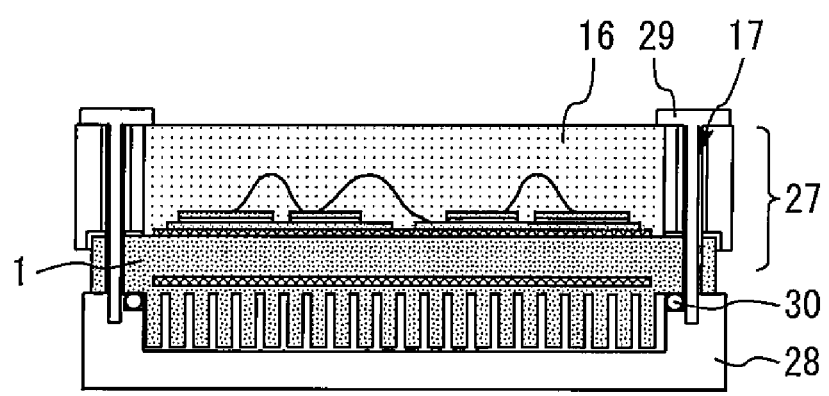
FIG. 4 is a cross-sectional view illustrating a semiconductor device according to Embodiment 1 of the present invention.

FIG. 4 is a cross-sectional view illustrating a semiconductor device according to Embodiment 1 of the present invention. To cool a semiconductor module 27 shown in FIGS. 1 to 3, a cooling jacket 28 is attached to the radiating surface side of the base plate 1 of the semiconductor module 27. More specifically, the cooling jacket 28 is attached to the semiconductor module 27 by passing a screw 29 through the hole 17 of the semiconductor module 27 and inserting the screw 29 into a screw hole of the cooling jacket 28. A sealing agent 30 such as an O-ring is disposed in a groove of the cooling jacket 28. Since a reactive force resulting from tightening of the screw 29 is received by the collar 18 having higher resistance, it is possible to suppress deformation of the base plate 1 peripheral to the hole 17 and the resin 16.

Figure 5:
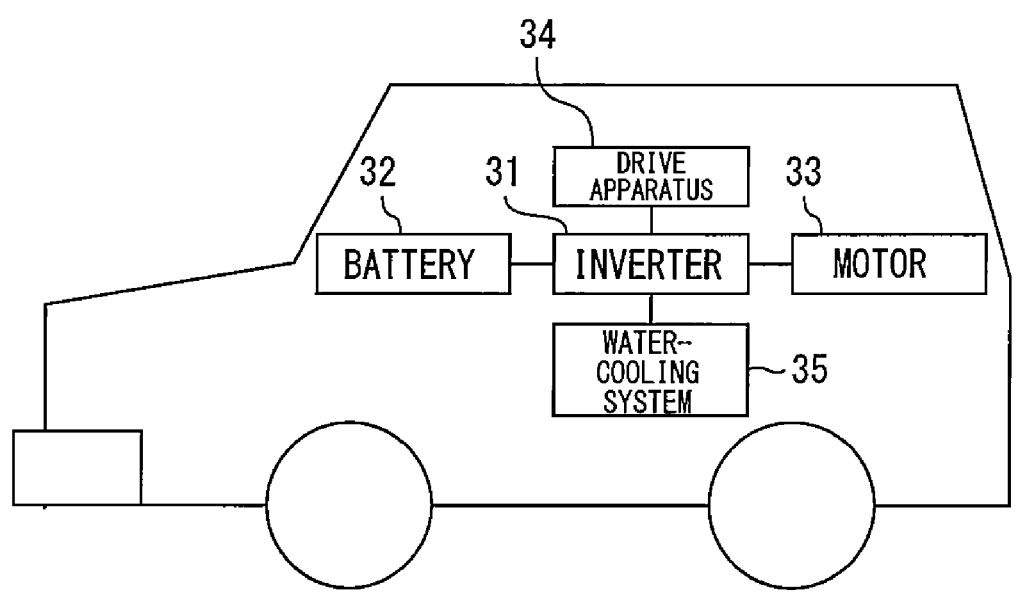
FIG. 5 is a diagram illustrating a vehicle according to Embodiment 1 of the present invention.

FIG. 5 is a diagram illustrating a vehicle according to Embodiment 1 of the present invention. The vehicle is a hybrid car or an electric car. In this vehicle, an inverter 31 converts a direct current of a battery 32 to a three-phase alternating current and supplies the alternating current to a motor 33. In this case, a drive apparatus 34 drives the inverter 31 to control the alternating current, and can thereby control the output of the motor 33. The above-described semiconductor module 27 corresponds to the inverter 31. Since the inverter 31 that handles large power has a large heat value, a water-cooling system 35 is used to cool the inverter 31. The above-described cooling jacket 28 is part of the water-cooling system 35.

Next, a manufacturing method for the semiconductor module according to the present embodiment will be described with reference to the attached drawings. FIGS. 6, 8 to 11 are cross-sectional views illustrating manufacturing steps of the semiconductor module according to Embodiment 1 of the present invention, and FIG. 7 is a top view illustrating manufacturing steps of the semiconductor module according to Embodiment 1 of the present invention.

Figure 6:
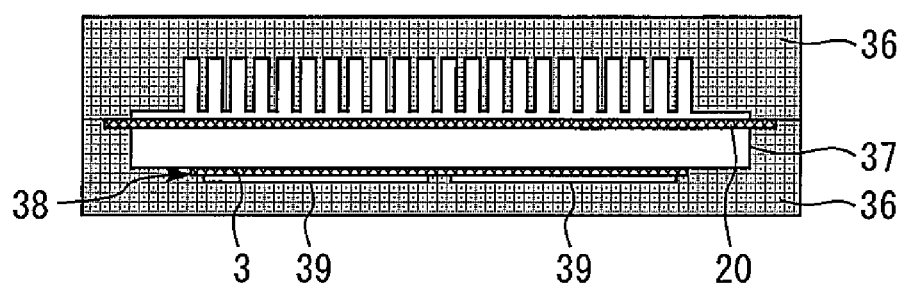
FIG. 6 is a cross-sectional view illustrating manufacturing steps of the semiconductor module according to Embodiment 1 of the present invention.
Figure 7:
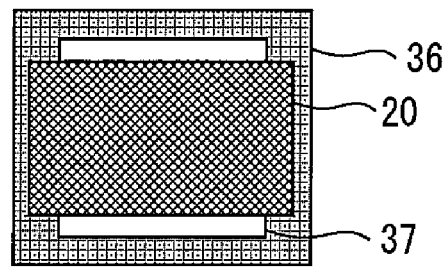
FIG. 7 is a top view illustrating manufacturing steps of the semiconductor module according to Embodiment 1 of the present invention.

First, as shown in FIG. 6 and FIG. 7, a carbon mold 36 is provided which can be separated into an upper mold and a lower mold. A cavity part 37 is formed in the mold 36, a concave part 38 is formed in a bottom surface of the cavity part 37 and a concave part 39 is formed in a bottom surface of the concave part 38. The insulating substrate 3 is placed in the concave part 38 of the mold 36, the reinforcing member 20 is placed so as to traverse the cavity part 37, and both ends of the reinforcing member 20 are sandwiched by the upper and lower molds of the mold 36. In this condition, a molten metal such as Al is poured into the heated mold 36, then cooled and made to coagulate to form the metal part 19 in the cavity part 37, and form the conductive patterns 4 and 5 in the concave part 39. When the metal part 19 and the conductive patterns 4 and 5 are made of the same material in this way, both can be manufactured as a single body. On the other hand, when both are made of different materials, the respective metals are poured onto the top surface and the undersurface of the insulating substrate 3 in different steps and using different molds respectively.

Figure 8:
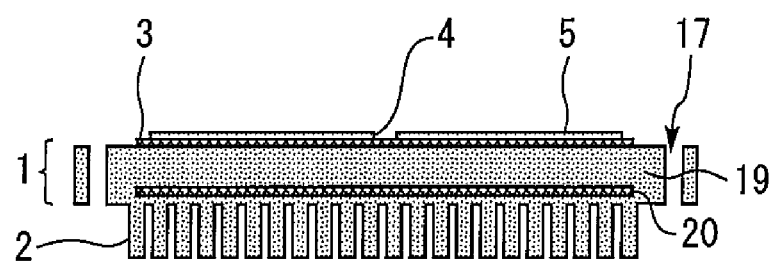
FIG. 8 is a cross-sectional view illustrating manufacturing steps of the semiconductor module according to Embodiment 1 of the present invention.

Next, as shown in FIG. 8, the base plate 1 and the insulating substrate 3 directly bonded to each other by melt-bonding are extracted from the mold 36. Both ends of the reinforcing member 20 sticking out of the base plate 1 are cut or removed by breaking or the like. Holes 17 are formed in the four corners of the base plate 1 using a drill or the like. As described above, by supporting the reinforcing member 20 with the mold 36, it is possible to control the position of the reinforcing member 20 in the base plate 1 in the plane direction and the thickness direction precisely, and thereby suppress warpage variations. Note that it has been confirmed that there is no crack or peeling in the interface between the base plate 1 and the insulating substrate 3 formed using the above-described manufacturing method.

Figure 9:
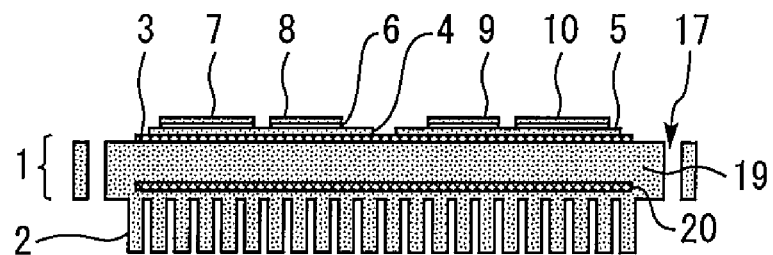
FIG. 9 is a cross-sectional view illustrating manufacturing steps of the semiconductor module according to Embodiment 1 of the present invention.

Next, as shown in FIG. 9, the conductive patterns 4 and 5 are formed on the insulating substrate 3 through sputtering. Ni plating (not shown) is applied to the conductive patterns 4 and 5 through electroless plating. The semiconductor chips 7 and 8 are bonded to the Ni plate of the conductive pattern 4 via the solder 6, and the semiconductor chips 9 and 10 are bonded to the Ni plate of the conductive pattern 5 via the solder 6.

Figure 10:
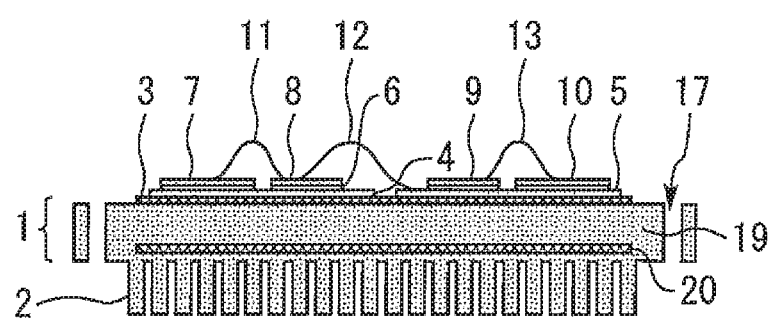
FIG. 10 is a cross-sectional view illustrating manufacturing steps of the semiconductor module according to Embodiment 1 of the present invention.

Next, as shown in FIG. 10, the top surfaces of the semiconductor chips 7 and 8 are connected using the Al wire 11, the top surface of the semiconductor chip 8 and the conductive pattern 5 are connected using the Al wire 12, and the top surfaces of the semiconductor chips 9 and 10 are connected using the Al wire 13.

Figure 11:
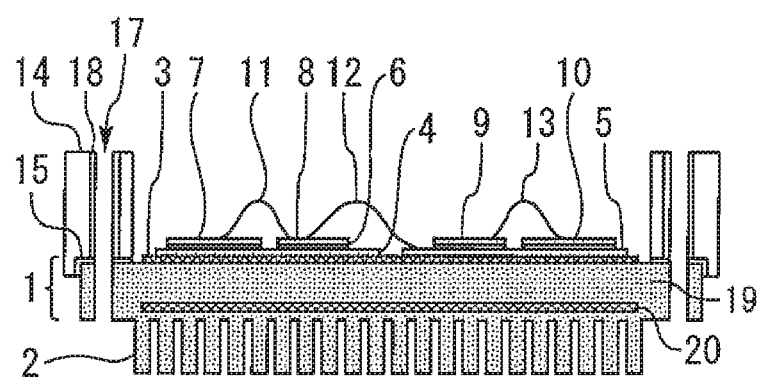
FIG. 11 is a cross-sectional view illustrating manufacturing steps of the semiconductor module according to Embodiment 1 of the present invention.

Next, as shown in FIG. 11, the resin-based case 14 that surrounds the insulating substrate 3, the conductive patterns 4 and 5, the semiconductor chips 7 to 10 and the Al wires 11 to 13 is bonded to the fixed surface of the base plate 1 using the adhesive 15. The resin 16 is potted using this case 14 as a mold. The case 14 is left as is as part of the semiconductor module 27.

As described above, in the present embodiment, the reinforcing member 20 is provided in the base plate 1, and warpage of the base plate 1 due to a temperature change can thereby be reduced considerably. For this reason, warpage of the entire semiconductor module 27 in which the base plate 1 is sealed with the resin 16 can also be reduced. As a result, since peeling of the resin 16 from the case 14 or the like is also suppressed, it is possible to improve reliability such as P/C or H/C properties. Since warpage of the semiconductor module 27 is so small, there is no need to tighten the screw 29 by such a strong force as to force the warpage and it is possible to reduce stress applied to the case 14. Note that it has been confirmed that even if a crack occurs in the reinforcing member 20, there is substantially no change in rigidity and thermal characteristics of the base plate 1.

Furthermore, sealing and fixing the semiconductor chips 7 to 10 and the base plate 1 using the resin 16 eliminates the need for inclusions such as the screw, plate member for preventing warpage of the module used to fix both components, grease, and can thereby reduce the number of parts. Moreover, since there is no need to interpose grease between the semiconductor chips 7 to 10, and the base plate 1, heat dissipation properties can be secured. Thus, it is possible to effectively dissipate heat generated by current application to the semiconductor chips 7 to 10 and reduce the size of the water-cooling system 35.

However, when the difference in the linear expansion coefficient between the base plate 1 and the resin 16 increases, warpage occurs in the entire semiconductor module 27. Thus, such resin 16 is selected whose linear expansion coefficient is a numerical value intermediate between the linear expansion coefficient of the metal part 19 and the linear expansion coefficient of the reinforcing member 20. This causes the linear expansion coefficient of the entire base plate 1 including the metal part 19 and the reinforcing member 20 to approximate to the linear expansion coefficient of the resin 16. Therefore, the difference in the linear expansion coefficient between parts above and below the insulating substrate 3 decreases, and it is thereby possible to further reduce warpage of the entire semiconductor module 27 due to a temperature change after the sealing with resin.

Furthermore, the material of the reinforcing member 20 is preferably the same as the material of the insulating substrate 3. In this way, it is possible to reduce warpage of the structure including the base plate 1 and the insulating substrate 3 bonded together. If the thickness of the reinforcing member 20 is the same as the thickness of the insulating substrate 3, it is possible to further reduce warpage of the structure.

Moreover, using an inexpensive Al wire as the wiring member can reduce the manufacturing cost. Using the case 14 as a mold when potting the resin 16 and using the case 14 as part of the semiconductor module 27 can omit a mold stripping step.

Since at least one protrusion structure 2 is provided on the radiating surface of the base plate 1, heat dissipation performance of the base plate 1 improves and a temperature rise of the semiconductor module 27 is suppressed. As a result, the life of the semiconductor module 27 is extended.

Furthermore, since the base plate 1 and the insulating substrate 3 are melt-bonded, both are bonded together firmly and H/C or P/C durability improves. However, the base plate 1 and the insulating substrate 3 may be bonded together using a bonding member such as solder as well. In this case, since the bonding member functions as a buffering member between the base plate 1 and the insulating substrate 3, stress applied to the insulating substrate 3 is reduced.

Furthermore, the semiconductor chips 7 to 10 may be bonded to the conductive pattern 4 by ultrasound. Such plating-less bonding with Al brazing improves the life of PC or HC. At least one opening may be provided in the reinforcing member 20. This can reduce the material of the reinforcing member 20 and improve heat dissipation properties of the base plate 1.

Embodiment 2

Figure 12:
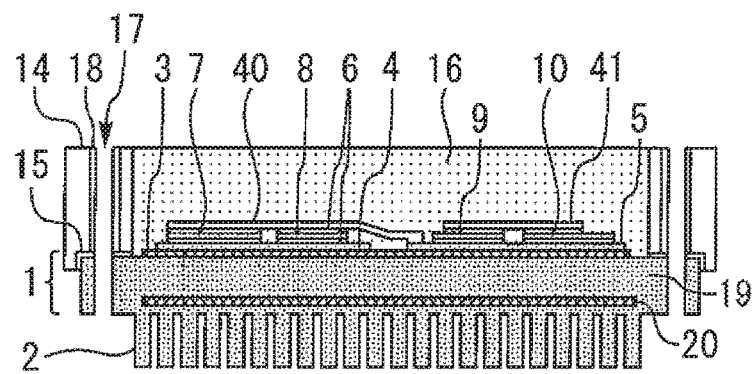
FIG. 12 is a cross-sectional view illustrating a semiconductor module according to Embodiment 2 of the present invention.

FIG. 12 is a cross-sectional view illustrating a semiconductor module according to Embodiment 2 of the present invention. The present embodiment uses Cu frames 40 and 41 as wiring members. Top surfaces of the semiconductor chips 7 and 8 are respectively connected to the Cu frame 40 via the solder 6. Top surfaces of the semiconductor chips 9 and 10 are respectively connected to the Cu frame 41 via the solder 6. The Cu frames 40 and 41 are extracted from the case 14 and function as electrodes. The semiconductor chips 7 and 8 are connected to the conductive pattern 5 via the Cu frame 40.

Figure 13:
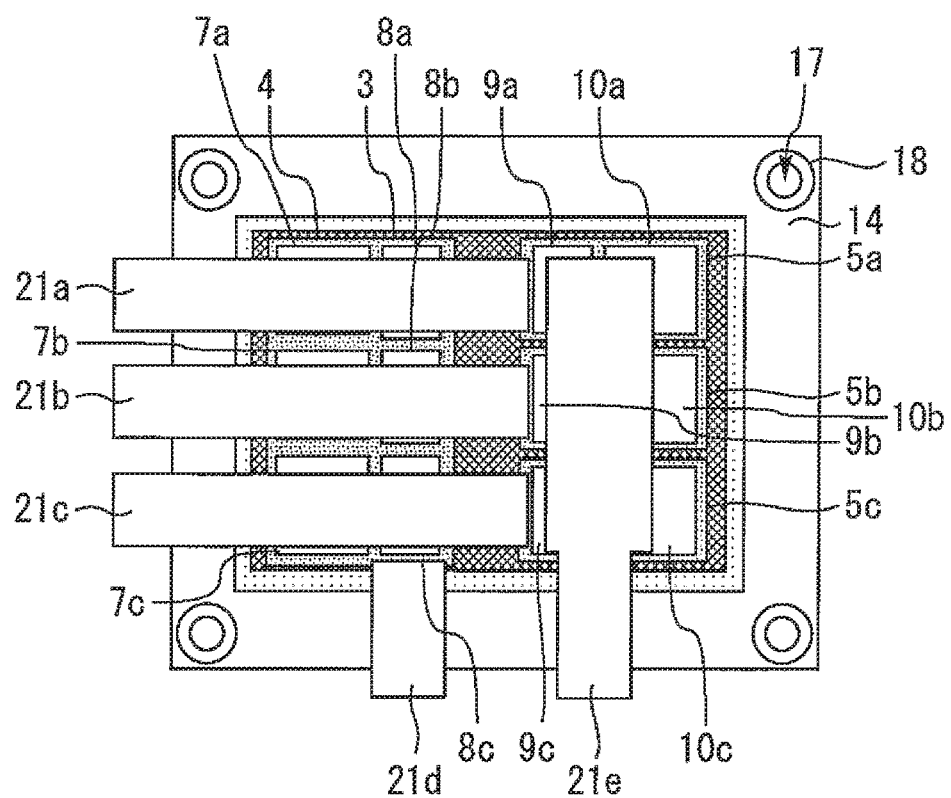
FIG. 13 is a top view illustrating the interior of the semiconductor module according to Embodiment 2 of the present invention.

FIG. 13 is a top view illustrating the interior of the semiconductor module according to Embodiment 2 of the present invention. Metal frames 21*a* to 21*c* correspond to the Cu frame 40 and a metal frame 21*e* corresponds to the Cu frame 41. The metal frame 21*a* is connected to a top surface of the switching element 7*a*, a top surface of the diode 8*a* and the conductive pattern 5*a*, the metal frame 21*b* is connected to a top surface of the switching element 7*b*, a top surface of the diode 8*b* and the conductive pattern 5*b*, and the metal frame 21*c* is connected to a top surface of the switching element 7*c*, a top surface of the diode 8*c* and the conductive pattern 5*c*. A metal frame 21*d* is connected to the conductive pattern 5*a*. A metal frame 21*e* is connected to top surfaces of diodes 9*a* to 9*c* and top surfaces of switching elements 10*a* to 10*c*.

Thus, using the Cu frames 40 and 41 increases a current cross-sectional area, and can thereby improve a current capacity of the semiconductor module 27. Since bonding strength between the wiring structure and the semiconductor chip improves, the life of H/C or P/C of the semiconductor module 27 is extended. Furthermore, since the Cu frames 40 and 41 have a greater heat transfer area than that of an Al wire, the amount of heat dissipation through the electrode increases.

Embodiment 3

Figure 14:
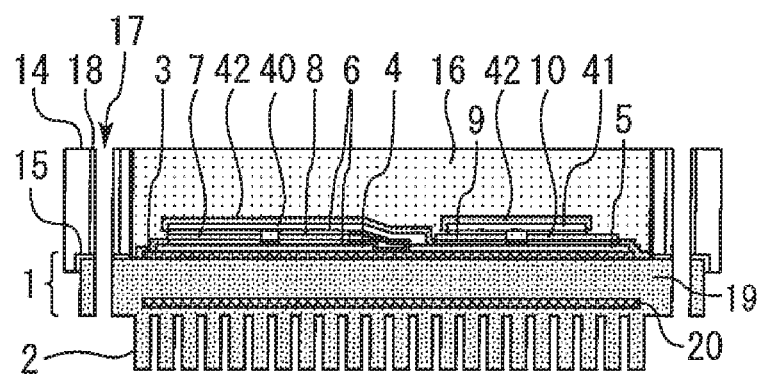
FIG. 14 is a cross-sectional view illustrating a semiconductor module according to Embodiment 3 of the present invention.

FIG. 14 is a cross-sectional view illustrating a semiconductor module according to Embodiment 3 of the present invention. In the present embodiment, at least part of the insulating substrate 3, the Cu frames 40 and 41, and the conductive patterns 4 and 5 is covered with a polyimide film 42. Since the polyimide film 42 improves adhesion among the insulating substrate 3, the wiring member, the conductive patterns 4 and 5 and the resin 16, the HC, PC life of the semiconductor module 27 is extended.

Embodiment 4

Figure 15:
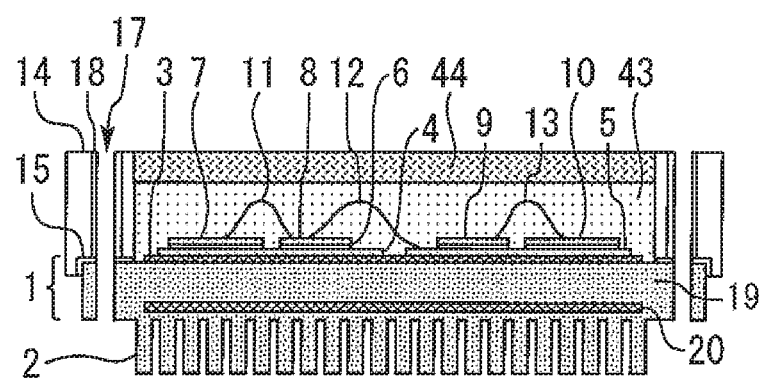
FIG. 15 is a cross-sectional view illustrating a semiconductor module according to Embodiment 4 of the present invention.

FIG. 15 is a cross-sectional view illustrating a semiconductor module according to Embodiment 4 of the present invention. Instead of the resin 16, the present embodiment uses first resin 43 that seals the periphery of the semiconductor chips 7 to 10 and the wiring member and second resin 44 that seals the outside of the first resin 43.

A Young's modulus of the first resin 43 is 100 MPa or higher and is higher than the Young's modulus of the second resin 44. Sealing the semiconductor chips 7 to 10 or the like with such hard first resin 43 allows a small amount of the first resin 43 to effectively extend the P/C, H/C life of the semiconductor module. Note that the second resin 44 may be gel.

In contrast to the description above, the Young's modulus of the first resin 43 may be lower than the Young's modulus of the second resin 44. In this case, by setting the linear expansion coefficient of the first resin 43 which is in contact with the base plate 1 to 6 to 16 ppm/° C. to be on the same level with the linear expansion coefficient of the base plate 1, it is possible to reduce the amount of warpage due to a temperature variation. Furthermore, covering the first resin 43 with the second resin 44 having a higher Young's modulus can improve rigidity of the entire semiconductor module 27 and suppress deformation by an external force.

Embodiment 5

Figure 16:
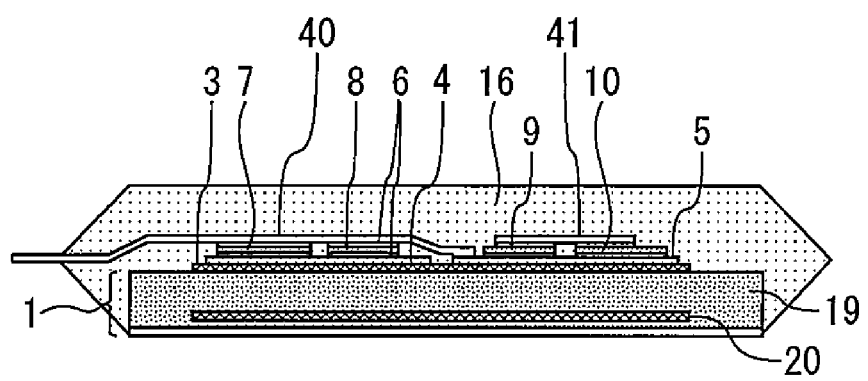
FIG. 16 is a cross-sectional view illustrating a semiconductor module according to Embodiment 5 of the present invention.

FIG. 16 is a cross-sectional view illustrating a semiconductor module according to Embodiment 5 of the present invention. In the present embodiment, the resin 16 is mold resin and no case 14 or the like exists. The rest of the configuration is similar to that of Embodiment 2. Similar effects can be obtained also when mold resin is used in this way. Note that as in the case of Embodiment 1, an Al wire may be used as the wiring member and the configurations in Embodiments 3 and 4 may be combined with this one.

In above Embodiments 1 to 5, the switching elements 7*a* to 7*c*, 10*a* to 10*c* are not limited to IGBTs, but may also be MOSFETs. The semiconductor chips 7 to 10 are not limited to chips formed of silicon, but may be each formed of a wide bandgap semiconductor which has a wider bandgap than silicon. Examples of the wide bandgap semiconductor include silicon carbide, nitride-gallium-based material or diamond. The semiconductor chips 7 to 10 formed of such a wide bandgap semiconductor have a higher withstand voltage and maximum allowable current density, and can thereby be downsized. Using such a downsized semiconductor chip can also downsize the semiconductor module 27 that incorporates this semiconductor chip. Furthermore, since the elements are highly heat-resistant, the protrusion structure 2 of heat sink can be downsized and the water-cooling system 35 can be implemented as an air-cooling system, the semiconductor module 27 can be further downsized. Since the semiconductor chips 7 to 10 have low power loss and exhibit high efficiency, the semiconductor module 27 can have higher efficiency. Note that although both the switching element and the diode are preferably formed of wide bandgap semiconductors, any one element may be formed of a wide bandgap semiconductor.

DESCRIPTION OF SYMBOLS

1 base plate, 2 protrusion structure, 3 insulating substrate, 4 conductive pattern, 5 conductive pattern, 7-10 semiconductor chip, 12 Al wire(wiring member, metal wire), 14 case, 16 resin, 19 metal part, 20 reinforcing member, 27 semiconductor module, 28 cooling jacket, 32 battery, 33 motor, 40 Cu frame(wiring member, metal frame), 42 polyimide film(coating film), 43 first resin, 44 second resin

The invention claimed is:
1. A semiconductor module comprising:
a base plate including a fixed surface and a radiating surface which is a surface opposite to the fixed surface;
an insulating substrate bonded to the fixed surface of the base plate;
first and second conductive patterns on the insulating substrate;
a semiconductor chip on the first conductive pattern;
a wiring member connecting the semiconductor chip to the second conductive pattern;
resin sealing the fixed surface of the base plate, the insulating substrate, the first and second conductive patterns, the semiconductor chip, and the wiring member; and a case surrounding the insulating substrate, the first and second conductive patterns, the semiconductor chip and the wiring member and bonded to the fixed surface of the base plate, wherein the base plate includes a single metal part, and a reinforcing member provided in the metal part and having a Young's modulus which is higher than a Young's modulus of the metal part, the base plate includes at least one protrusion structure integrally formed with the metal part and protruding outward from the radiating surface, the metal part having a constant thickness at every position except positions where the at least one protrusion structure protrudes outward from the radiating surface, a thickness of the reinforcing member is smaller than the thickness of the metal part, the entire reinforcing member is located on the protrusion structure side with respect to the center of the base plate in cross section of the base plate, the resin includes first resin sealing peripheries of the semiconductor chip and the wiring member and second resin sealing the outside of the first resin, the first resin has a Young's modulus which is lower than a Young's modulus of the second resin, the first resin is thicker than the second resin, when viewed in cross-section, and the first resin is potted using the case as a mold.

2. The semiconductor module of claim 1, wherein a linear expansion coefficient of the first resin is a numerical value intermediate between a linear expansion coefficient of the metal part and a linear expansion coefficient of the reinforcing member.

3. The semiconductor module of claim 2, wherein the linear expansion coefficient of the first resin is 8 to 16 ppm/° C., and a linear expansion coefficient of the base plate is 10 to 20 ppm/° C.

4. The semiconductor module of claim 1, wherein material of the reinforcing member is the same as material of the insulating substrate.

5. The semiconductor module of claim 4, wherein thickness of the reinforcing member is the same as thickness of the insulating substrate.

6. The semiconductor module of claim 1, wherein the wiring member is a metal wire.

7. The semiconductor module of claim 1, wherein the wiring member is a metal frame.

8. The semiconductor module of claim 1, wherein the first resin is mold resin.

9. The semiconductor module of claim 1, wherein the base plate and the insulating substrate are melt-bonded together.

10. The semiconductor module of claim 1, wherein the base plate and the insulating substrate are bonded together using a bonding member.

11. The semiconductor module of claim 1, wherein the semiconductor chip is bonded to the first conductive pattern by ultrasound.

12. The semiconductor module of claim 1, wherein at least one opening is provided in the reinforcing member.

13. A semiconductor device comprising:
the semiconductor module of claim 1; and
a cooling jacket attached to the radiating surface side of the base plate of the semiconductor module and cooling the semiconductor module.

14. A vehicle comprising:
the semiconductor module of claim 1;
a battery; and
a motor,
wherein the semiconductor module converts a direct current of the battery to an alternating current and supplies the alternating current to the motor.

15. The semiconductor module of claim 1, wherein the second resin is in direct contact with the outside of the first resin.

* * * * *